(12) United States Patent
Matsuura et al.

(10) Patent No.: US 7,449,367 B2
(45) Date of Patent: Nov. 11, 2008

(54) ADHESIVE FILM FOR SEMICONDUCTOR, METAL SHEET WITH SUCH ADHESIVE FILM, WIRING SUBSTRATE WITH ADHESIVE FILM, SEMICONDUCTOR DEVICE, AND METHOD FOR MANUFACTURING SEMICONDUCTOR DEVICE

(75) Inventors: Hidekazu Matsuura, Ichihara (JP); Toshiyasu Kawai, Chiba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 197 days.

(21) Appl. No.: 10/519,713

(22) PCT Filed: Feb. 19, 2004

(86) PCT No.: PCT/JP2004/001866

§ 371 (c)(1),
(2), (4) Date: Dec. 30, 2004

(87) PCT Pub. No.: WO2004/075293

PCT Pub. Date: Sep. 2, 2004

(65) Prior Publication Data

US 2006/0043607 A1  Mar. 2, 2006

(30) Foreign Application Priority Data

Feb. 19, 2003  (JP) .............................. 2003-040904

(51) Int. Cl.
*H01L 21/00* (2006.01)

(52) U.S. Cl. ............... 438/118; 257/783; 257/E23.017; 257/E23.041; 257/E23.055; 257/E21.513

(58) Field of Classification Search ................. 438/124, 438/113, 114, 118; 257/E23.017, E23.041, 257/E23.055, E21.513
See application file for complete search history.

(56) References Cited

U.S. PATENT DOCUMENTS

| 5,273,938 | A | * | 12/1993 | Lin et al. ................ 438/107 |
| 6,132,865 | A | * | 10/2000 | Oka et al. ................ 428/344 |
| 6,586,081 | B1 | * | 7/2003 | Nishinaka et al. ......... 428/209 |
| 6,856,235 | B2 | * | 2/2005 | Fjelstad ................... 338/324 |
| 6,879,026 | B2 | * | 4/2005 | Fukumoto et al. .......... 257/642 |

FOREIGN PATENT DOCUMENTS

JP  03-094460  4/1991

(Continued)

OTHER PUBLICATIONS http://en.wikipedia.org/wiki/Functional_group.*
http://en.wikipedia.org/wiki/Ether.*

(Continued)

*Primary Examiner*—Matthew S. Smith
*Assistant Examiner*—Julio J Maldonado
(74) *Attorney, Agent, or Firm*—Antonelli, Terry, Stout & Kraus, LLP.

(57) ABSTRACT

An adhesive film for semiconductor use of the present invention is used in a method in which, after the adhesive film for semiconductor use is laminated to one side of a metal sheet, the metal sheet is processed to give a wiring circuit, a semiconductor die is mounted and molded, and the adhesive film is then peeled off. The adhesive film includes a resin layer A formed on one side or both sides of a support film, the 90 degree peel strength between the resin layer A and the metal sheet prior to the processing of the metal sheet laminated with the adhesive film for semiconductor use to give the wiring circuit is 20 N/m or greater at 25° C., and the 90 degree peel strengths, after molding with a molding compound the wiring circuit laminated with the adhesive film for semiconductor use, between the resin layer A and the wiring circuit and between the resin layer A and the molding compound are both 1000 N/m or less at at least one point in the temperature range of 0° C. to 250° C.

26 Claims, 2 Drawing Sheets

FOREIGN PATENT DOCUMENTS

| | | |
|---|---|---|
| JP | 10-012773 | 1/1998 |
| JP | 11-121646 | 4/1999 |
| JP | 2000-294580 | 10/2000 |
| WO | WO 01/35460 A1 | 5/2001 |
| WO | WO 2004/075293 A1 | 9/2004 |

OTHER PUBLICATIONS

Korean Official Action, for Application No. 10-2004-7021221, dated Apr. 25, 2006.

Korean Official Action, for Application No. 10-2004-7021221, dated Sep. 13, 2006.

Korean Official Action, for Application No. 10-2004-7021221, mailed Jan. 9, 2007.

Official Action, for Chinese Patent Application No. 2004800004384, issued Jan. 26, 2007.

Chinese Official Action for Application No. 2004800004384, dated Jul. 6, 2007.

Japanese Notice of Reason(s) for Refusal (Official Action) for Application No. 2005-502757, mailed Oct. 30, 2007.

* cited by examiner

ADHESIVE FILM FOR SEMICONDUCTOR, METAL SHEET WITH SUCH ADHESIVE FILM, WIRING SUBSTRATE WITH ADHESIVE FILM, SEMICONDUCTOR DEVICE, AND METHOD FOR MANUFACTURING SEMICONDUCTOR DEVICE

TECHNICAL FIELD

The present invention relates to an adhesive film for semiconductor use that enables a semiconductor package to be produced with high workability since the adhesive film can be peeled off easily from a wiring circuit and a molding resin; a metal sheet laminated with the adhesive film, a wiring circuit laminated with the adhesive film, and a semiconductor device that employ the adhesive film for semiconductor use; and a method for producing a semiconductor device.

BACKGROUND ART

In order to achieve a smaller, thinner semiconductor package, a package having a structure in which only one side (semiconductor die side) of a lead frame is molded and exposed leads on the reverse side are used for external connection has been developed in recent years. A package with this structure has the advantages of achieving a smaller, thinner semiconductor package since the leads do not project from a molding resin. For example, a method in which, after an adhesive tape is laminated to one side of a lead frame, a chip is mounted on the opposite side of the lead frame, wire bonded, and molded, and subsequently the adhesive tape is peeled off has been proposed (ref. e.g. Japanese Patent Application Laid-open No. 10-12773 (Claim 4), Japanese Patent Application Laid-open No. 2000-294580 (Claim 1)). However, when a lead frame is used, there are restrictions on the thickness and the material of the lead frame, and there are the problems that the semiconductor package is still high, fine wiring cannot be formed, etc.

As another method for producing a semiconductor package that is similar to the above-mentioned package, a method has been proposed in which, after a metal layer is formed on a temporary support substrate, a circuit is formed, and a chip is mounted, wire bonded, and molded, the temporary support substrate is peeled off, but it is not clear what properties are required for the temporary support substrate in order to prevent resin from going around between the wiring circuit and the support substrate when molding, and to prevent glue residue from being present on the wiring circuit after peeling off the support substrate (ref. e.g. Japanese Patent Application Laid-open No. 11-121646 (Claims 4 and 5, [0013][0018])).

DISCLOSURE OF INVENTION

It is an object of the present invention to provide an adhesive film for semiconductor use that has sufficient adhesive strength to a metal sheet, can be easily peeled off after molding with a resin, and possesses various properties required for semiconductor applications, and to provide a metal sheet laminated with the adhesive film, a wiring circuit laminated with the adhesive film, and a semiconductor device using the adhesive film.

It is also an object of the present invention to provide a method for producing a semiconductor device, the method enabling a high density and small area and thickness semiconductor device to be produced with excellent productivity.

That is, the present invention relates to an adhesive film for semiconductor use that is used in a method in which, after the adhesive film for semiconductor use is laminated to one side of a metal sheet, the metal sheet is processed to give a wiring circuit, a semiconductor die is mounted and molded, and the adhesive film is then peeled off, the adhesive film comprising a support film and a resin layer A formed on one side or both sides of the support film, the 90 degree peel strength between the resin layer A and the metal sheet prior to the processing of the metal sheet laminated with the adhesive film for semiconductor use to give the wiring circuit being 20 N/m or greater at 25° C., and the 90 degree peel strengths, after molding with a molding compound the wiring circuit laminated with the adhesive film for semiconductor use, between the resin layer A and the wiring circuit and between the resin layer A and the molding compound both being 1000 N/m or less at at least one point in the temperature range of 0° C. to 250° C.

In the present invention, it is preferable for the 90 degree peel strengths between the resin layer A and the wiring circuit and between the resin layer A and the molding compound after molding with the molding compound to both be 1000 N/m or less at at least one point in the temperature range of 100° C. to 250° C.

In the present invention, it is preferable for the 90 degree peel strengths between the resin layer A and the wiring circuit and between the resin layer A and the molding compound to both be 1000 N/m or less at a temperature at which, after molding with the molding compound, the adhesive film for semiconductor use is peeled off from the wiring circuit and the molding compound.

In the present invention, it is preferable for the resin layer A to have a glass transition temperature of 100° C. to 300° C. It is also preferable for the temperature at which the resin layer A shows a 5 wt % loss to be 300° C. or greater.

In the present invention, it is preferable for the resin layer A to have a elastic modulus at 230° C. of 1 MPa or greater. It is also preferable for the resin layer A to comprise a thermoplastic resin having an amide group, an ester group, an imide group, an ether group, or a sulfone group. In particular, it is preferable for the resin layer A to comprise a thermoplastic resin having an amide group, an ester group, an imide group, or an ether group.

In the present invention, it is preferable for the material of the support film to be one selected from the group consisting of an aromatic polyimide, an aromatic polyamide, an aromatic polyamideimide, an aromatic polysulfone, an aromatic polyethersulfone, a polyphenylene sulfide, an aromatic polyetherketone, a polyarylate, an aromatic polyetheretherketone, and a polyethylene naphthalate.

In the present invention, it is preferable for the ratio (A/B) of the thickness (A) of the resin layer A to the thickness (B) of the support film to be 0.5 or less. It is also preferable for the thickness of the adhesive film for semiconductor use of the present invention to be 200 μm or less.

In the present invention, it is preferable for the resin layer A, which has adhesion, to be formed on one side of the support film, and for a resin layer B having no adhesion and a elastic modulus at 230° C. of 10 MPa or greater to be formed on the opposite side.

Furthermore, the present invention relates to a metal sheet laminated with the adhesive film in which the adhesive film for semiconductor use of the present invention is laminated to a metal sheet, and a wiring circuit laminated with the adhesive film that is obtained by processing the metal sheet to give a wiring circuit.

Moreover, the present invention relates to a semiconductor device laminated with the adhesive film for semiconductor use employing the adhesive film for semiconductor use of the present invention.

It is preferable for the semiconductor device laminated with the adhesive film for semiconductor use of the present invention to comprise the adhesive film for semiconductor use, the wiring circuit that is laminated so that one side thereof is in contact with the resin layer A of the adhesive film for semiconductor use, a semiconductor die electrically connected to an exposed surface of the wiring circuit, and the molding compound that molds the semiconductor die. In particular, it is preferable for the semiconductor device laminated with the adhesive film for semiconductor use of the present invention to comprise the adhesive film for semiconductor use, the wiring circuit formed so that one side thereof is in contact with the resin layer A of the adhesive film for semiconductor use, the semiconductor die bonded to a die pad on an exposed surface of the wiring circuit, a wire for providing a connection between the semiconductor die and an inner lead of the wiring circuit, and the molding compound that molds the semiconductor die and the wire.

Moreover, the present invention relates to a semiconductor device obtained by peeling off the adhesive film for semiconductor use from the above-mentioned semiconductor device laminated with the adhesive film for semiconductor use.

Furthermore, the present invention relates to a method for producing a semiconductor device, the method comprising a step of laminating an adhesive film for semiconductor use to one side of a metal sheet, a step of processing the metal sheet to give a wiring circuit, a step of electrically connecting a semiconductor die onto an exposed surface of the wiring circuit, a step of molding the semiconductor die and the exposed surface of the wiring circuit with a molding compound, and a step of peeling off the adhesive film for semiconductor use from the wiring circuit and the molding compound, and preferably to a method for producing a semiconductor device, the method comprising a step of laminating an adhesive film for semiconductor use to one side of a metal sheet, a step of processing the metal sheet to give a wiring circuit having a die pad and an inner lead, a step of bonding a semiconductor die to the die pad on an exposed surface of the wiring circuit, a step of connecting the semiconductor die and the inner lead via a wire by means of wire bonding, a step of molding the exposed surface of the wiring circuit, the semiconductor die, and the wire with a molding compound, and a step of peeling off the adhesive film for semiconductor use from the wiring circuit and the molding compound.

With regard to the method for producing a semiconductor device of the present invention, when the wiring circuit is formed from a plurality of patterns each having a die pad and an inner lead, the wiring circuit is divided as necessary into a plurality of semiconductor devices each having one semiconductor die.

It is preferable for the method for producing a semiconductor device of the present invention to employ, as the adhesive film for semiconductor use, the adhesive film for semiconductor use of the present invention, and for it to comprise laminating the resin layer A of the adhesive film for semiconductor to a metal sheet and processing the metal sheet to give a wiring circuit.

BEST MODE FOR CARRYING OUT THE INVENTION

Modes for carrying out the adhesive film for semiconductor use of the present invention, the metal sheet laminated with the adhesive film, the wiring circuit laminated with the adhesive film for semiconductor use, and the semiconductor device using same, and the method for producing a semiconductor device are now explained in detail.

Adhesive Film for Semiconductor Use

The adhesive film for semiconductor use of the present invention can be used suitably in, for example, a method for producing a semiconductor device. When the adhesive film for semiconductor use of the present invention is used in the method for producing a semiconductor device, it is preferable to produce the semiconductor device by a method comprising the following steps.

That is, (1) a step of laminating the adhesive film for semiconductor use of the present invention to a metal sheet at 150° C. to 400° C., (2) a step of processing the metal sheet to give a wiring circuit, (3) a step of bonding a semiconductor die to a die pad of the wiring circuit using an adhesive such as a silver paste or a die bond film and, as necessary, heating at 140° C. to 200° C. for 30 min to 2 hours so as to harden the silver paste, etc. adhesive, (4) a step of wire bonding the semiconductor die and an inner lead of the wiring circuit via gold wire, etc. using a temperature of 150° C. to 270° C. in combination with ultrasound, (5) a step of molding with a molding compound at 150° C. to 200° C., (6) a step of hardening the molding compound, which is a resin, by heating at 150° C. to 200° C. for 4 to 6 hours, and (7) a step of peeling off the adhesive film for semiconductor use from the wiring circuit and the molding compound at 0° C. to 250° C. When the wiring circuit is formed from a plurality of patterns each having a die pad and an inner lead, the wire circuit is divided as necessary into a plurality of semiconductor devices each having one semiconductor die.

In the present invention, in particular, the 90 degree peel strength at 25° C. between the metal sheet and the resin layer A prior to processing the metal sheet to give a wiring circuit is 20 N/m or greater, preferably 50 N/m or greater, more preferably 70 N/m or greater, yet more preferably 100 N/m or greater, and particularly preferably 150 N/m or greater. In the present invention, the 90 degree peel strength at 25° C. between the resin layer A and the metal sheet is measured in accordance with a 90 degree peel method of JIS Z 0237 by peeling off the adhesive film for semiconductor use in a direction at 90 degrees to the metal sheet. Specifically, the 90 degree peel strength when peeling off the adhesive film for semiconductor use at 25° C. with a speed of 270 to 330 mm/min, and preferably 300 mm/min, is measured using a 90 degree peel tester (manufactured by Tester Sangyo Co., Ltd.). If the 90 degree peel strength is less than 20 N/m, circuit formation defects such as circuit erosion due to penetration of an etching solution during processing of the metal sheet easily occur, and when the wiring circuit is narrow, there is the problem that the adhesive film for semiconductor use is easily peeled off from the wiring circuit during a step in which the wiring circuit laminated with the adhesive film for semiconductor use is washed or transported. Furthermore, when the wiring circuit is subjected to plating with gold, silver, palladium, etc., there is the problem that the plating solution easily enters between the wiring circuit and the resin layer A. Moreover, there is the problem that during the molding step, the molding resin enters between the wiring circuit and the resin layer A. Furthermore, it is preferable for this 90 degree peel strength to be no more than 2000 N/m, more preferably no more than 1500 N/m, and yet more preferably no more than 1000 N/m.

The conditions for laminating the adhesive film for semiconductor use and the metal sheet in order to measure the peel strength are not particularly limited, but it is preferable to employ the laminating conditions described below in relation to the method for producing a wiring circuit laminated with the adhesive film for semiconductor use of the present invention. For example, as the metal sheet a palladium-coated copper sheet or 42 alloy sheet is used, and laminating is carried out under laminating conditions selected from any one of (1) temperature 250° C., pressure 8 MPa, time 10 sec, (2) temperature 350° C., pressure 3 MPa, time 3 sec, and (3) temperature 280° C., pressure 6 MPa, time 10 sec.

In the present invention, the 90 degree peel strength at 25° C. between the resin layer A and the wiring circuit immediately before carrying out the molding step is preferably 5 N/m or greater, more preferably 10 N/m or greater, and yet more preferably 50 N/m or greater. If the 90 degree peel strength immediately before carrying out the molding step is less than 5 N/m, there is the problem that the molding resin enters between the wiring circuit and the resin layer A during the molding step, etc.

'Immediately before carrying out the molding step' referred to above means a state which is before the molding step and in which all steps that are to be carried out prior to the molding step are completed.

It is also possible to improve the adhesive strength between the resin layer A and the wiring circuit by heating prior to the molding step. The heating temperature is not particularly limited, but it is preferable to heat at 100° C. or higher in order to improve the adhesive strength between the resin layer A and the wiring circuit. Furthermore, it is preferable to heat at no more than 300° C. from the viewpoint of the heat resistance of the wiring circuit and the adhesive film for semiconductor use. For similar reasons, it is more preferable to heat at 130° C. or higher and no more than 270° C. Moreover, the heating time is not particularly limited, but it is preferable for it to be 10 sec or longer in order to sufficiently improve the adhesive strength between the resin layer A and the wiring circuit. For the same reasons, the heating time is more preferably 1 min or longer and not more than 2 hours.

From the viewpoint of productivity the above-mentioned heating step is preferably carried out by heating in various steps (for example, a step of hardening an adhesive such as a silver paste, a step of wire bonding) prior to the molding step. For example, as described above, in the step of bonding the semiconductor die, heating is usually carried out at 140° C. to 200° C. for 30 min to 2 hours in order to harden the adhesive used for bonding. Furthermore, in the wire bonding step, heating is usually carried out at on the order of 150° C. to 270° C. for on the order of 3 min to 30 min. The above-mentioned heating step can therefore be carried out by heating in these steps.

In the present invention, the 90 degree peel strengths at at least one point in the temperature range of 0° C. to 250° C. between the resin layer A and the wiring circuit and between the resin layer A and the molding compound after molding with the molding compound are measured in accordance with the 90 degree peel method of JIS Z 0237 by peeling off the adhesive film in a direction at 90 degrees to the wiring circuit while keeping the wiring circuit and the adhesive film at room temperature or in an oven at 0° C. to 250° C. Specifically, the 90 degree peel strength when peeling off the adhesive film for semiconductor use at at least one point in the temperature range of 0° C. to 250° C. with a speed of 270 to 330 mm/min, and preferably 300 mm/min, is measured using a Tensilon RTM-100 (manufactured by Orientech). The temperature at which this peel strength is measured is preferably in the range of 100° C. to 250° C., and more preferably 150° C. to 250° C.

The 90 degree peel strengths at at least one point in the temperature range of 0° C. to 250° C. between the resin layer A and the wiring circuit and between the resin layer A and the molding compound after molding with the molding compound are both made to be no more than 1000 N/m, preferably no more than 800 N/m, and more preferably no more than 500 N/m. If this 90 degree peel strength exceeds 1000 N/m, stress is put on the wiring circuit or the molding compound, thus giving rise to the problem of breakage. The higher the measurement temperature, the lower the 90 degree peel strength usually is. The 90 degree peel strengths are preferably 0 N/m or greater, more preferably 3N/m or greater, and yet more preferably 5 N/m or greater.

In the present invention, it is preferable that the 90 degree peel strengths between the resin layer A and the wiring circuit and between the resin layer A and the molding compound are both no more than 1000 N/m at the temperature at which, after the wiring circuit laminated with the adhesive film for semiconductor use is molded with the molding compound, the adhesive film for semiconductor use is peeled off from the wiring circuit and the molding compound. The temperature at which the adhesive film for semiconductor use is peeled off after being molded with the molding compound is usually preferably between 0° C. to 250° C.

The conditions under which molding with the molding compound is carried out for measuring the 90 degree peel strength at at least one point in the above-mentioned temperature range of 0° C. to 250° C. are not particularly limited, but it is preferable to carry out molding under the molding conditions of the method for producing a semiconductor device of the present invention, which will be described later. For example, CEL-9200 (product name, a biphenyl molding compound manufactured by Hitachi Chemical Co., Ltd.) is used as the molding compound, molding is carried out under conditions of a temperature of 180° C., a pressure of 10 MPa, and a time of 3 min, and this is followed by heating at 180° C. for 5 hours so as to harden the molding compound.

In the present invention, with regard to the adhesive film for semiconductor use, there can be cited one having the resin layer A formed on one side or both sides of a support film, and one having the resin layer A formed on one side of a support film and having another resin layer formed on the opposite side thereof.

In the present invention, the method for forming the resin layer A on the support film is not particularly limited, and after one side or both sides of the support film is coated with an adhesive varnish prepared by dissolving a resin (a) that is used for formation of the resin layer A in a solvent such as N-methyl-2-pyrrolidone, dimethylacetamide, diethylene glycol dimethyl ether, tetrahydrofuran, cyclohexanone, methyl ethyl ketone, or dimethylformamide, a heat treatment is carried out so as to remove the solvent, and an adhesive film having a two-layer structure or a three-layer structure can thus be obtained. Alternatively, after one side or both sides of the support film is coated with a precursor varnish in which a resin (a) precursor (e.g. a polyamide acid) is dissolved in a solvent, the resin (a) precursor becoming the heat resistant resin (a) (e.g. polyimide resin) as a result of a heat treatment, etc. after applying the varnish, the heat treatment is carried out, and an adhesive film having a two-layer structure or a three-layer structure can thus be obtained. In this case, the heat treatment after coating enables the solvent to be removed and the precursor to be converted into the resin (a) (e.g. imidization). From the viewpoint of the surface state, etc. of the coated side, it is preferable to use the adhesive varnish.

When the varnish-coated support film is subjected to the heat treatment so as to remove the solvent or carry out imidization, etc., the treatment temperature depends on whether the varnish is an adhesive varnish or a precursor varnish. In the case of the adhesive varnish, the temperature is chosen so that the solvent can be removed, and in the case of the precursor varnish, the treatment temperature is preferably the glass transition temperature of the resin layer A or higher in order to carry out imidization.

The method for coating one side of the support film with the adhesive varnish or the precursor varnish described above is not particularly limited, and the method can involve, for example, roll coating, reverse roll coating, gravure coating, bar coating, or comma coating. It is also possible to coat the support film by passing it through the adhesive varnish or the precursor varnish.

In the present invention, the glass transition temperature of the resin layer A is preferably 100° C. to 300° C., more preferably 150° C. to 300° C., and particularly preferably 150° C. to 250° C. If the glass transition temperature thereof is less than 100° C., when the adhesive film is peeled off from the wiring circuit and the molding compound, the resin layer A and the support film might peel apart at the interface therebetween, or there is a tendency for the resin layer A to be susceptible to cohesive failure. Furthermore, there may be a tendency for resin to be left behind on the wiring circuit and the molding compound, and for the resin layer A to soften due to heat generated in the wire bonding step, thus causing a poor wire joint. Moreover, the resin layer A tends to soften due to heat generated in the molding step, thereby easily causing the problem that the molding compound enters between the wiring circuit and the resin layer A, etc. If the glass transition temperature exceeds 300° C., the resin layer A does not soften sufficiently during laminating, and the 90 degree peel strength with the wiring circuit at 25° C. tends to deteriorate.

In the present invention, the temperature at which the resin layer A shows a 5 wt % loss is preferably 300° C. or higher, more preferably 350° C. or higher, and yet more preferably 400° C. or higher. If the temperature at which the resin layer A shows a 5 wt % loss is less than 300° C., outgassing occurs as a result of the heat when the adhesive film is laminated to the metal sheet or the heat in the wire bonding step, and the wiring circuit and the wire tend to be contaminated. The temperature at which the resin layer A shows a 5 wt % loss is measured using differential thermal analysis (TG/DTA220 manufactured by Seiko Instruments & Electronics Ltd.) at a rate of temperature increase of 10° C./min.

In the present invention, it is preferable for the resin layer A to have a elastic modulus at 230° C. of 1 MPa or greater, and more preferably 3 MPa or greater. The wire bonding temperature is not particularly limited and is generally on the order of 200° C. to 260° C., and a temperature of around 230° C. is widely employed. Therefore, if the elastic modulus at 230° C. is less than 1 MPa, the resin layer A softens due to the heat in the wire bonding step, thus easily causing a poor wire joint. The upper limit of the elastic modulus at 230° C. of the resin layer A is preferably 2000 MPa, more preferably 1500 MPa, and yet more preferably 1000 MPa. The elastic modulus at 230° C. of the resin layer A is measured using a DVE RHEOSPECTOLER dynamic viscoelastometer (manufactured by Rheology Co., Ltd.) at a rate of temperature increase of 2° C./min in tension mode with a measurement frequency of 10 Hz.

In the present invention, the resin (a), which is used in formation of the resin layer A, is preferably a thermoplastic resin having an amide group (—NHCO—), an ester group (—CO—O—), an imide group (—CO)$_2$—N—, an ether group (—O—), or a sulfone group (—SO$_2$—). In particular, it is preferably a thermoplastic resin having an amide group, an ester group, an imide group, or an ether group. Specific examples thereof include an aromatic polyamide, an aromatic polyester, an aromatic polyimide, an aromatic polyamideimide, an aromatic polyether, an aromatic polyetheramideimide, an aromatic polyetheramide, an aromatic polyesterimide, and an aromatic polyetherimide.

Among these, the aromatic polyetheramideimide, the aromatic polyetherimide, and the aromatic polyetheramide are preferable from the viewpoint of heat resistance, adhesion, chemical resistance during processing of the metal sheet, and plating resistance when the wiring circuit is subjected to plating as necessary.

All of the above-mentioned resins can be produced by polycondensation of a base component such as an aromatic diamine or a bisphenol and an acid component such as a dicarboxylic acid, a tricarboxylic acid, or a tetracarboxylic acid, an aromatic chloride, or a reactive derivative thereof. That is, a known method employed in a reaction between an amine and an acid can be employed, and the various conditions, etc. are not particularly limited. With regard to a polycondensation reaction between a diamine and an aromatic dicarboxylic acid, an aromatic tricarboxylic acid, or a reactive derivative thereof, a known method is employed.

Examples of the base components that are suitably used in synthesis of the aromatic polyetherimide, the aromatic polyetheramideimide, or the aromatic polyetheramide include aromatic diamines having an ether group such as 2,2-bis[4-(4-aminophenoxy)phenyl]propane, bis[4-(4-aminophenoxy)phenyl]sulfone, 4,4'-diaminodiphenyl ether, 1,3-bis(3-aminophenoxy)benzene, bis[4-(4-aminophenoxy)phenyl]ether, and 2,2-bis[4-(4-aminophenoxy)phenyl]hexafluoropropane; aromatic diamines having no ether group such as 4,4'-methylenebis(2,6-diisopropylamine); siloxane diamines such as 1,3-bis(3-aminopropyl)tetramethyldisiloxane; and α,ω-diaminoalkanes such as 1,12-diaminododecane and 1,6-diaminohexane. Of the total amount of the base components, the aromatic diamine having an ether group is used in an amount of 40 to 100 mol %, and preferably 50 to 97 mol %, and at least one type selected from the aromatic diamine having no ether group, the siloxane diamine, and the α,ω-diaminoalkane is used in an amount of 0 to 60 mol %, and preferably 3 to 50 mol %. Preferred specific examples of the base component include (1) a base component comprising 60 to 89 mol %, preferably 68 to 82 mol %, of the aromatic diamine having an ether group, 1 to 10 mol %, preferably 3 to 7 mol %, of the siloxane diamine, and 10 to 30 mol %, preferably 15 to 25 mol %, of the α,ω-diaminoalkane, (2) a base component comprising 90 to 99 mol %, preferably 93 to 97 mol %, of the aromatic diamine having an ether group, and 1 to 10 mol %, preferably 3 to 7 mol %, of the siloxane diamine, and (3) a base component comprising 40 to 70 mol %, preferably 45 to 60 mol %, of the aromatic diamine having an ether group, and 30 to 60 mol %, preferably 40 to 55 mol %, of the aromatic diamine having no ether group.

Examples of the acid component that is used in synthesis of the aromatic polyetherimide, the aromatic polyetheramideimide, or the aromatic polyetheramide include (A) mononuclear aromatic tricarboxylic anhydrides and mononuclear aromatic tetracarboxylic dianhydrides such as trimellitic anhydride, reactive derivatives of trimellitic anhydride such as trimellitic anhydride chloride, and pyromellitic dianhydride, (B) polynuclear aromatic tetracarboxylic dianhydrides such as bisphenol A bistrimellitate dianhydride and oxydiphthalic anhydride, and (C) aromatic dicarboxylic acids such as terephthalic acid, isophthalic acid, and reactive derivatives of phthalic acid such as terephthalic acid chloride and isophthalic acid chloride.

In particular, it is suitable to use an aromatic polyetheramideimide obtained by reaction of 1 mol of the base component (1) or (2) with 0.95 to 1.05 mol, preferably 0.98 to 1.02 mol, of the acid component (A), and an aromatic polyetherimide obtained by reaction of 1 mole of the base component (3) with 0.95 to 1.05 mol, preferably 0.98 to 1.02 mol, of the acid component (B).

In the present invention, a filler such as a ceramic powder, a glass powder, a silver powder, a copper powder, resin particles, or rubber particles, or a coupling agent may be added to the resin (a).

When the filler is added, the amount thereof added is preferably 1 to 30 parts by weight relative to 100 parts by weight of the resin (a), and more preferably 5 to 15 parts by weight.

With regard to the coupling agent, although coupling agents such as a vinylsilane, an epoxysilane, an aminosilane, a mercaptosilane, a titanate, an aluminum chelate, and a zircoaluminate can be used, a silane coupling agent is preferable. Examples of the silane coupling agent include silane coupling agents having an organic reactive group as a terminal group such as vinyltrimethoxysilane, vinyltriethoxysilane, vinyltris(β-methoxyethoxy)silane, β-(3,4-epoxycyclohexyl)ethyltrimethoxysilane, γ-glycidoxypropyltrimethoxysilane, γ-glycidoxypropylmethyldiethoxysilane, N-β-(aminoethyl)-γ-aminopropylmethyldimethoxysilane, γ-aminopropyltriethoxysilane, N-phenyl-γ-aminopropyltrimethoxysilane, and γ-mercaptopropyltrimethoxysilane, and among these an epoxysilane coupling agent having an epoxy group is preferably used. The organic reactive group referred to here means a functional group such as an epoxy group, a vinyl group, an amino group, or a mercapto group. The silane coupling agent is added in order to improve the adhesion between the resin and the support film and prevent the resin layer and the support film from being easily peeled apart at the interface therebetween when the adhesive film is peeled off at 100° C. to 300° C. The amount of coupling agent added is preferably 1 to 15 parts by weight relative to 100 parts by weight of the resin (a), and more preferably 2 to 10 parts by weight.

In the present invention, the support film is not particularly limited, but it is preferable to use a film comprising a resin that can withstand heat generated during a resin coating step, a drying step, and a semiconductor device assembly step, and the resin is preferably selected from the group consisting of an aromatic polyimide, an aromatic polyamide, an aromatic polyamideimide, an aromatic polysulfone, an aromatic polyethersulfone, a polyphenylenesulfide, an aromatic polyetherketone, a polyarylate, an aromatic polyetheretherketone, and a polyethylene naphthalate. The glass transition temperature of the support film is preferably 200° C. or higher, and more preferably 250° C. or higher, in order to improve the heat resistance. Use of the above-mentioned heat-resistant resin film can prevent the support film from softening and enables operations to be carried out efficiently in steps in which heat is applied, such as the bonding step, the wire bonding step, the molding step, and the peeling off step.

The above-mentioned support film is preferably has a sufficiently high adhesion with the resin layer A. If the adhesion is low, when the adhesive film is peeled off from the wiring circuit and the molding compound at a temperature of 100° C. to 300° C., peeling easily occurs at the interface between the resin layer A and the support film, and resin is easily left behind on the wiring circuit and the molding compound. Since it is preferable for the support film to have heat resistance and a sufficiently high adhesion with the resin layer A, a polyimide film is preferable.

The type of polyimide film is not particularly limited, but in order to reduce distortion of the metal sheet after the adhesive film for semiconductor use is laminated thereto, the coefficient of linear thermal expansion at 20° C. to 200° C. is preferably $3.0 \times 10^{-5}$/° C. or less, more preferably $2.5 \times 10^{-5}$/° C. or less, and yet more preferably $2.0 \times 10^{-5}$/° C. or less. Furthermore, in order to reduce distortion of the metal sheet after the adhesive film for semiconductor use is laminated to the metal sheet, the thermal shrinkage ratio when heated at 200° C. for 2 hours is preferably 0.15% or less, more preferably 0.1% or less, and particularly preferably 0.05% or less.

The support film is preferably subjected to a surface treatment in order to sufficiently increase the adhesion with the resin layer A. The method for treating the surface of the support film is not particularly limited, but examples thereof include chemical treatments such as alkali treatment and silane-coupling treatment; physical treatments such as sand matte treatment; plasma treatment; and corona treatment.

The thickness of the support film is not particularly limited, but in order to reduce distortion of the metal sheet after the adhesive film for semiconductor use is laminated thereto, the thickness is preferably 100 μm or less, more preferably 50 μm or less, and yet more preferably 25 μm or less. The thickness of the support film is preferably no less than 5 μm, and more preferably no less than 10 μm.

It is also possible to select the material of the support film from other than the above-mentioned resins, that is, the material can be selected from the group consisting of copper, aluminum, stainless steel, and nickel. By employing the above metals as the support film, it is possible to make the coefficient of linear thermal expansion of the support film close to that of the metal sheet, thus reducing distortion of the metal sheet laminated with the adhesive film after the adhesive film for semiconductor use is laminated to the metal sheet.

The thickness of the adhesive film for semiconductor use of the present invention is not particularly limited, but since the larger the peeling angle during peeling, the easier the peeling, the thickness is preferably 200 μm or less, more preferably 100 μm or less, and yet more preferably 50 μm or less.

With regard to the adhesive film for semiconductor use of the present invention, when the resin layer is provided on one side or both sides of the support film, and particularly when the resin layer A is provided on one side of the support film, the ratio (A/B) of the thickness (A) of the resin layer to the thickness (B) of the support film is preferably 0.5 or less, more preferably 0.3 or less, and yet more preferably 0.2 or less. If the ratio (A/B) of the thickness (A) of the resin layer to the thickness (B) of the support film exceeds 0.5, the adhesive film easily curls due to a reduction in volume of the resin layer when the solvent is removed after coating, and the workability and the productivity when the adhesive film is laminated to the metal sheet tend to deteriorate. When both sides of the support film are provided with a resin layer, the ratio of the thicknesses of the two resin layers is preferably 0.8:1 to 1.2:1, more preferably 0.9:1 to 1.1:1, and particularly preferably 1:1. The thickness (A) of the resin layer A is preferably 1 to 20 μm, more preferably 3 to 15 μm, and yet more preferably 4 to 10 μm.

In order to counterbalance the curl of the adhesive film for semiconductor use due to a reduction in volume of the resin layer A during removal of the solvent, the resin layer A may be provided on both sides of the support film. It is preferable to provide one side of the support film with the resin layer A, and to provide the opposite side with a resin layer that is resistant to softening at high temperature. That is, it is preferable for the resin layer A, which has adhesion, to be formed on one side of the support film, and for a resin layer B having a elastic modulus at 230° C. of 10 MPa or greater and having no adhesion to be formed on the opposite side.

In the present invention, the elastic modulus at 230° C. of the resin layer B having no adhesion is preferably 10 MPa or greater, more preferably 100 MPa or greater, and yet more preferably 1000 MPa or greater. If the elastic modulus at 230° C. of the resin layer B is less than 10 MPa, the resin layer B easily softens in steps such as the wire bonding step where heat is applied, and it tends to stick to a die or a jig. This elastic modulus is preferably no more than 2000 MPa, and more preferably no more than 1500 MPa.

The adhesive strength of the resin layer B, which has no adhesion, toward the die or the jig is not particularly limited as long as it is low enough that the resin layer B does not stick to the die or the jig during processing, but it is preferable for the 90 degree peel strength at 25° C. between the resin layer B and the die or the jig to be less than 5 N/m, and more preferably 1 N/m or less. This peel strength is measured, for example, after compression laminating to a brass die at 250° C. with a pressure of 8 MPa for 10 sec.

In order to prevent the resin layer B from easily softening and sticking to the die or the jig during the bonding step, the wire bonding step, the molding step, the peeling off step, etc., the glass transition temperature of the resin layer B having a elastic modulus at 230° C. of 10 MPa or greater is preferably 150° C. or higher, more preferably 200° C. or higher, and yet more preferably 250° C. or higher. This glass transition temperature is preferably no more than 350° C., and more preferably no more than 300° C.

The composition of a resin (b) that is used in formation of the resin layer B is not particularly limited, and either a thermoplastic resin or a thermosetting resin can be used. The composition of the thermoplastic resin is not particularly limited, but it is preferable, as with the above-mentioned resin, to use a thermoplastic resin having an amide group, an ester group, an imide group, or an ether group. In particular, it is preferable to use an aromatic polyetheramideimide obtained by reaction of 1 mol of the base component (3) above with 0.95 to 1.05 mol, more preferably 0.98 to 1.02 mol, of the acid component (A). The composition of the thermosetting resin is not particularly limited, but it is preferable to use, for example, an epoxy resin, a phenol resin, a bismaleimide resin (e.g., a bismaleimide resin formed using a bis(4-maleimidophenyl)methane monomer), etc. It is also possible to use a thermoplastic resin and a thermosetting resin in combination. When the thermoplastic resin and the thermosetting resin are combined, it is preferable to use 5 to 100 parts by weight, more preferably 20 to 70 parts by weight, of the thermosetting resin relative to 100 parts by weight of the thermoplastic resin.

Furthermore, it is preferable to add to the resin (b) a filler such as a ceramic powder, a glass powder, a silver powder, a copper powder, resin particles, or rubber particles, or a coupling agent. When the filler is added, the amount thereof added is preferably 1 to 30 parts by weight relative to 100 parts by weight of the resin (b), and more preferably 5 to 15 parts by weight. The amount of coupling agent added is preferably 1 to 20 parts by weight relative to 100 parts by weight of the resin (b), and more preferably 5 to 15 parts by weight.

The method for forming the resin layer B, which has no adhesion, on the support film is not particularly limited, but it can usually be formed by coating the support film with a resin varnish prepared by dissolving the resin (b) in a solvent such as N-methyl-2-pyrrolidone, dimethylacetamide, diethylene glycol dimethyl ether, tetrahydrofuran, cyclohexanone, methyl ethyl ketone, or dimethylformamide, and then carrying out a heat treatment so as to remove the solvent. Alternatively, it can be formed by coating the support film with a precursor varnish in which a resin (b) precursor (e.g. a polyamide acid) is dissolved in a solvent, the resin (b) precursor becoming the heat resistant resin (b) (e.g. a polyimide resin) as a result of a heat treatment, etc. after applying the varnish, and then carrying out the heat treatment. In this case, the solvent is removed by the heat treatment after coating, thus converting the precursor into the resin (b) (e.g. imidization). From the viewpoint of the surface state, etc. of the coated side, it is preferable to use the resin varnish.

The treatment temperature when the varnish-coated support film is subjected to the heat treatment in order to remove the solvent or carry out imidization, etc. depends on whether the resin varnish or the precursor varnish is used. In the case of the resin varnish, the temperature may be determined so that the solvent can be removed, and in the case of the precursor varnish, the treatment temperature is preferably the glass transition temperature of the resin layer B or higher in order to carry out imidization.

When a thermosetting resin or a combination of a thermoplastic resin and a thermosetting resin is used as the resin (b), it is also possible to make the elastic modulus of the resin layer B 10 MPa or greater by a heat treatment after coating so as to harden the thermosetting resin. This heat treatment can be carried out at the same time as removal of the solvent or imidization, or separately therefrom.

This resin layer B enables curl of the adhesive film for semiconductor use due to a reduction in volume of the resin layer A to be counterbalanced by a reduction in volume of the resin layer B during removal of the solvent or shrinkage during imidization or hardening of the thermosetting resin.

The method for applying the resin varnish or the precursor varnish for the resin (b) is not particularly limited, and can be carried out by, for example, roll coating, reverse roll coating, gravure coating, bar coating, or comma coating. It is also possible to coat the support film by passing it through the resin varnish or the precursor varnish.

Metal Sheet Laminated with the Adhesive Film and Wiring Circuit Laminated with the Adhesive Film The metal sheet laminated with the adhesive film and the wiring circuit laminated with the adhesive film for semiconductor use of the present invention can be produced by, for example, laminating the adhesive film for semiconductor use of the present invention to one side of a metal sheet so that the resin layer A is in contact with said one side.

In the present invention, the conditions under which the adhesive film for semiconductor use is laminated to the metal sheet are not particularly limited, but the conditions are set so that the 90 degree peel strength at 25° C. between the metal sheet and the resin layer A prior to processing of the metal sheet is 20 N/m or greater. If the 90 degree peel strength is less than 20 N/m, circuit formation defects such as circuit erosion due to penetration of an etching solution during processing of the metal sheet easily occur, and when the wiring circuit is narrow, there are the problems that the adhesive film for semiconductor use is easily peeled off from the wiring circuit during a step in which the wiring circuit laminated with the adhesive film is washed or transported, and the molding resin enters between the wiring circuit and the resin layer A during the molding step. It is preferable for this 90 degree peel strength to be no more than 2000 N/m, more preferably no more than 1500 N/m, and yet more preferably no more than 1000 N/m.

In the present invention, the laminating temperature is preferably in the range of 150° C. to 400° C., more preferably 180° C. to 350° C., and yet more preferably 200° C. to 300° C. If the temperature is less than 150° C., the 90 degree peel strength between the metal sheet and the resin layer A tends to deteriorate. If it exceeds 400° C., the metal sheet tends to deteriorate.

In the present invention, the laminating pressure with which the adhesive film for semiconductor use is laminated to the metal sheet is preferably in the range of 0.5 to 30 MPa, more preferably 1 to 20 MPa, and yet more preferably 3 to 15 MPa. If the laminating pressure is less than 0.5 MPa, the 90 degree peel strength between the resin layer A and the metal sheet tends to deteriorate. If it exceeds 30 MPa, the metal sheet tends to fracture.

In the present invention, the laminating time for which the adhesive film for semiconductor use is laminated to the metal sheet is preferably in the range of 0.1 to 60 sec, more preferably 1 to 30 sec, and yet more preferably 3 to 20 sec. If the laminating time is less than 0.1 sec, the 90 degree peel strength between the resin layer A and the metal sheet tends to decrease. If it exceeds 60 sec, the workability and the productivity tend to deteriorate. It is also preferable to carry out preheating for on the order of 5 to 60 sec prior to the pressure being applied.

In the present invention, the material of the metal sheet is not particularly limited, and it is possible to use, for example, an iron-based alloy such as 42 alloy, copper or a copper-based alloy, aluminum, or a composite multilayer foil in which aluminum and copper are laminated. The production method is not limited either, and electrolytic foil, rolled foil, etc. can be used. The surface of the metal sheet of copper or copper-based alloy may be coated with palladium, nickel, gold, silver, etc.

The thickness of the metal sheet is not particularly limited either, but the thinner it is, the better the processing of fine detail in the metal sheet, that is, the better the formation of the wiring circuit. It is preferably 0.1 to 500 µm, and particularly preferably 1 to 50 µm. It is yet more preferably 3 to 15 µm. If the thickness is greater than 500 µm, it takes time to form a circuit, and since the wiring circuit laminated with the adhesive film has poor flexibility, when it is produced by a reel-to-reel method, problems occur in a transporting step, etc. Furthermore, it becomes impossible to reduce the thickness of the semiconductor package. If it is less than 0.1 µm, wire bonding is difficult, and there is a possibility that a fault in the electrical continuity might occur when connecting a package to a wiring board.

The method for processing the metal sheet to give a wiring circuit is not particularly limited. For example, after a light-sensitive film is laminated to the side of the metal sheet laminated with the adhesive film that is opposite to the side with the adhesive film, it is exposed with a wiring circuit mask superimposed thereon, the light-sensitive film is developed, and etching is then carried out using a chemical that dissolves the metal sheet (e.g., in the case of copper, a ferric chloride solution, a cupric chloride solution, or an alkali etching solution) to give a wiring circuit having an inner lead, a die pad, etc.

After processing the metal sheet to give the wiring circuit, the circuit may be subjected to plating with gold, silver, palladium, etc.

Semiconductor Device

The structure of the semiconductor device produced using the adhesive film for semiconductor use of the present invention is not particularly limited, and it may be a faceup structure or a facedown structure. There can be cited as an example a package (Non Lead Type Package) having a structure in which only one side (semiconductor die side) of the package is molded, and exposed leads on the reverse side are used for external connection. Specific examples of this package include QFN (Quad Flat Non-leaded Package), SON (Small Outline Non-leaded Package), and LGA (Land Grid Array).

The semiconductor device of the present invention is produced by, for example, peeling off the adhesive film for semiconductor use from a semiconductor device laminated with the adhesive film comprising the adhesive film for semiconductor use, a wiring circuit to which the adhesive film for semiconductor use is laminated so that one side of the wiring circuit is in contact with the resin layer A, a semiconductor die electrically connected to an exposed surface of the wiring circuit, and a molding compound that molds the semiconductor die. The semiconductor device of the present invention is preferably produced by, for example, peeling off the adhesive film for semiconductor use from a semiconductor device laminated with the adhesive film having a structure comprising the adhesive film for semiconductor use, a wiring circuit to which the adhesive film for semiconductor use is laminated so that one side of the wiring circuit is in contact with the resin layer A, a semiconductor die bonded to a die pad of the wiring circuit, a wire providing a connection between the semiconductor die and an inner lead of the wiring circuit, and a molding compound that molds the semiconductor die and the wire.

The semiconductor device produced using the adhesive film for semiconductor use of the present invention is excellent in terms of high density, small area, low profile, etc., and is incorporated into information equipment such as mobile phones.

Method for Producing Semiconductor Device

The method for producing the semiconductor device of the present invention comprises a step of laminating an adhesive film for semiconductor use to one side of a metal sheet, a step of processing the metal sheet to give a wiring circuit, a step of electrically connecting a semiconductor die to an exposed surface of the wiring circuit, a step of molding the semiconductor die and the exposed surface of the wiring circuit with a molding compound, and a step of peeling off the adhesive film for semiconductor use from the wiring circuit and the molding compound. The method for producing the semiconductor device of the present invention preferably comprises a step of laminating an adhesive film for semiconductor use to one side of a metal sheet, a step of processing the metal sheet to give a wiring circuit having a die pad and an inner lead, a step of bonding a semiconductor die to the die pad on an exposed surface of the wiring circuit, a step of connecting the semiconductor die and the inner lead via wire by means of wire bonding, a step of molding the exposed surface of the wiring circuit, the semiconductor die, and the wire with a molding compound, and a step of peeling off the adhesive film for semiconductor use from the wiring circuit and the molding compound.

In the present invention, when the wiring circuit is formed from a plurality of patterns each having a die pad and an inner lead, by dividing the molded wiring circuit as necessary, a plurality of semiconductor devices each having one semiconductor die can be obtained. This dividing step may be carried out either after the molding step or after the step of peeling off the adhesive film for semiconductor use.

The metal sheet that can be used in the production method of the present invention, laminating conditions when the adhesive film for semiconductor use is laminated to the metal sheet, and the method for processing the metal sheet to give a wiring circuit are the same as those described above with respect to the production of the wiring circuit laminated with the adhesive film of the present invention.

In the production method of the present invention, when the metal sheet laminated with the adhesive film or the wiring circuit laminated with the adhesive film of the present invention is available, the production method may be started from that stage.

An adhesive that is used for bonding a semiconductor die to the die pad of the wiring circuit is not particularly limited and, for example, an adhesive paste such as a silver paste or an adhesive tape can be used. After the semiconductor die is bonded to the die pad, the adhesive is usually heated at 140° C. to 200° C. for 30 min to 2 hours so as to harden it.

In the present invention, the material of the wire used in wire bonding is not particularly limited, but examples thereof include gold wire. In the wire bonding step, the wire is joined to the semiconductor die and the inner lead by the combined use of, for example, ultrasound and heating at 200° C. to 270° C.

In the present invention, the material of the molding compound is not particularly limited, but examples thereof include epoxy resins such as a cresol novolac epoxy resin, a phenol novolac epoxy resin, a biphenyldiepoxy, and a naphthol novolac epoxy resin.

The molding compound may contain an additive such as a filler or a flame-retardant material, for example, a bromine compound. The molding conditions under which molding is carried out with the molding compound are not particularly limited, but molding is usually carried out by heating at 150° C. to 200° C. with a pressure of 10 to 15 MPa for 2 to 5 min. Molding may be carried out by individual piece molding in which each of the semiconductor dies is molded individually one at a time or by batch molding in which a large number of semiconductor dies are molded simultaneously.

The temperature at which the adhesive film for semiconductor use is peeled off after molding with the molding compound is preferably in the range of 0° C. to 250° C. If the temperature is less than 0° C., it is easy for resin to be left behind on the wiring circuit and the molding compound. If the temperature exceeds 250° C., the wiring circuit and the molding compound tend to deteriorate. For the same reasons, the temperature is more preferably 100° C. to 200° C., and particularly preferably 150° C. to 250° C.

In general, after molding with the molding compound, there is a step of heating and hardening the molding compound at on the order of 150° C. to 200° C. for a few hours. The step of peeling off the adhesive film for semiconductor use from the molding compound and the wiring circuit may be carried out either before or after the step of hardening the molding compound.

In the present invention, after molding with the molding compound, when the adhesive film for semiconductor use is peeled off at 0° C. to 250° C., it is preferable for there not to be any resin residue on the wiring circuit or the molding compound. If there is a large amount of resin residue, not only is the appearance degraded, but also the resin residue might cause a poor contact when the wiring circuit is used for an external connection.

The resin residue on the wiring circuit and the molding compound is therefore preferably removed by mechanical brushing, a solvent, etc. The solvent is not particularly limited, but N-methyl-2-pyrrolidone, dimethylacetamide, diethylene glycol dimethyl ether, tetrahydrofuran, cyclohexanone, methyl ethyl ketone, dimethylformamide, etc. are preferable.

The adhesive film thus peeled off often has a surface state that is different from the original surface state due to a resin defect, molding compound residue, transfer of unevenness of the wiring circuit, etc., and cannot be reused in practice.

Since the adhesive film for semiconductor use of the present invention has high adhesion at 25° C. with the metal sheet prior to processing of the metal sheet, and can easily be peeled off from the wiring circuit and the molding resin at 0° C. to 250° C. after molding with the resin, it is possible to form a thin wiring circuit having a thickness of on the order of 0.1 to 500 μm without giving rise to problems in any of the steps, for example, the metal sheet processing step, thus enabling the semiconductor package to be produced with high workability and productivity.

Furthermore, the semiconductor device of the present invention fabricated using this adhesive film for semiconductor use is excellent in terms of high density, small area, and low profile and is suitable for use in, for example, information equipment such as mobile phones.

EXAMPLES

The present invention is now explained specifically with reference to Examples, but the present invention is not limited thereto.

Production Example 1

Production of Aromatic Polyetheramideimide Adhesive Varnish for Use in Examples 1 to 4, 7, and 8

A 5 L four-necked flask equipped with a thermometer, a stirrer, a nitrogen inlet, and a fractionating column was charged under an atmosphere of nitrogen with 258.3 g (0.63 mol) of 2,2-bis[4-(4-aminophenoxy)phenyl]propane and 10.4 g (0.042 mol) of 1,3-bis(3-aminopropyl)tetramethyldisiloxane, which were then dissolved in 1450 g of N-methyl-2-pyrrolidone. This solution was heated to 70° C., and 33.6 g (0.168 mol) of 1,12-diaminododecane was dissolved therein. This solution was then cooled to 0° C., and 180.4 g (0.857 mol) of trimellitic anhydride chloride was added thereto. When the trimellitic anhydride chloride dissolved, 130 g of triethylamine was added. Stirring was continued at room temperature for 2 hours, the mixture was then heated to 180° C., and a reaction was carried out for 5 hours so as to complete imidization. The reaction mixture thus obtained was poured into methanol so as to isolate a polymer. This polymer was dried and then dissolved in N-methyl-2-pyrrolidone, and the solution was poured into methanol so as to isolate the polymer again. Subsequently, the polymer was dried under vacuum to give a purified polyetheramideimide powder. 120 g of the polyetheramideimide powder thus obtained and 6 g of a silane coupling agent (product name: SH6040, manufactured by Shin-Etsu Chemical Co., Ltd.) were dissolved in 360 g of N-methyl-2-pyrrolidone to give an aromatic polyetheramideimide adhesive varnish.

Production Example 2

Production of Aromatic Polyetheramideimide Adhesive Varnish for Use in Examples 5 and 6

A 5 L four-necked flask equipped with a thermometer, a stirrer, a nitrogen inlet, and a fractionating column was charged under an atmosphere of nitrogen with 258.6 g (0.63 mol) of 2,2-bis[4-(4-aminophenoxy)phenyl]propane and 67.0 g (0.27 mol) of 1,3-bis(3-aminopropyl)tetramethyldisiloxane, which were then dissolved in 1550 g of N-methyl-2-pyrrolidone. This solution was then cooled to 0° C., and 187.3 g (0.89 mol) of trimellitic anhydride chloride was added thereto at this temperature. When the trimellitic anhydride chloride dissolved, 100 g of triethylamine was added. Stirring was continued at room temperature for 2 hours, the mixture was then heated to 180° C., and a reaction was carried out for 5 hours so as to complete imidization. The reaction mixture thus obtained was poured into methanol so as to isolate a polymer. This polymer was dried and then dissolved in N-methyl-2-pyrrolidone, and the solution was poured into methanol so as to isolate the polymer again. Subsequently, the polymer was dried under vacuum to give a purified polyetheramideimide powder. 120 g of the polyetheramideimide powder thus obtained and 3.6 g of a silane coupling agent (product name: SH6040, manufactured by Shin-Etsu Chemical Co., Ltd.) were dissolved in 360 g of N-methyl-2-pyrrolidone to give an aromatic polyetheramideimide adhesive varnish.

Production Example 3

Production of Aromatic Polyetheramideimide Varnish for Use in Resin Layer B in Example 5

A 5 L four-necked flask equipped with a thermometer, a stirrer, a nitrogen inlet, and a fractionating column was charged under an atmosphere of nitrogen with 172.4 g (0.42 mol) of 2,2-bis[4-(4-aminophenoxy)phenyl]propane and 153.7 g (0.42 mol) of 4,4'-methylenebis(2,6-diisopropylaniline), which were then dissolved in 1550 g of N-methyl-2-pyrrolidone. This solution was then cooled to 0° C., and 174.7 g (0.83 mol) of trimellitic anhydride chloride was added thereto at this temperature. When the trimellitic anhydride chloride dissolved, 130 g of triethylamine was added. Stirring was continued at room temperature for 2 hours, the mixture was then heated to 180° C., and a reaction was carried out for 5 hours so as to complete imidization. The reaction mixture thus obtained was poured into methanol so as to isolate a polymer. This polymer was dried and then dissolved in N-methyl-2-pyrrolidone, and the solution was poured into methanol so as to isolate the polymer again. Subsequently, the polymer was dried under vacuum to give a purified polyetheramideimide powder. 120 g of the polyetheramideimide powder thus obtained and 6 g of a silane coupling agent (product name: SH6040, manufactured by Shin-Etsu Chemical Co., Ltd.) were dissolved in 360 g of N-methyl-2-pyrrolidone to give an aromatic polyetheramideimide varnish.

Production Example 4

Synthesis of Aromatic Polyetheramideimide Powder for Use in Resin Layer B in Example 6

A 5 L four-necked flask equipped with a thermometer, a stirrer, a nitrogen inlet, and a fractionating column was charged under an atmosphere of nitrogen with 270.9 g (0.66 mol) of 2,2-bis[4-(4-aminophenoxy)phenyl]propane and 8.7 g (0.035 mol) of 1,3-bis(3-aminopropyl)tetramethyldisiloxane, which were then dissolved in 1950 g of N-methyl-2-pyrrolidone. This solution was then cooled to 0° C., and 149.5 g (0.71 mol) of trimellitic anhydride chloride was added thereto at this temperature. When the trimellitic anhydride chloride dissolved, 100 g of triethylamine was added. Stirring was continued at room temperature for 2 hours, the mixture was then heated to 180° C., and a reaction was carried out for 5 hours so as to complete imidization. The reaction mixture thus obtained was poured into methanol so as to isolate a polymer. This polymer was dried and then dissolved in N-methyl-2-pyrrolidone, and the solution was poured into methanol so as to isolate the polymer again. Subsequently, the polymer was dried under vacuum to give a purified aromatic polyetheramideimide powder.

Production Example 5

Production of Aromatic Polyetheramideimide Adhesive Varnish for Use in Example 9

120 g of the polyetheramideimide powder obtained in Production Example 4 and 3.6 g of a silane coupling agent (product name: SH6040, manufactured by Shin-Etsu Chemical Co., Ltd.) were dissolved in 360 g of N-methyl-2-pyrrolidone to give an aromatic polyetheramideimide adhesive varnish.

Production Example 6

Production of Aromatic Polyetherimide Adhesive Varnish for Use in Example 10

A 5 L four-necked flask equipped with a thermometer, a stirrer, a nitrogen inlet, and a fractionating column was charged under an atmosphere of nitrogen with 102.5 g (0.25 mol) of 2,2-bis[4-(4-aminophenoxy)phenyl]propane and 91.5 g (0.25 mol) of 4,4'-methylenebis(2,6-diisopropylaniline), which were then dissolved in 1900 g of N-methyl-2-pyrrolidone. This solution was then cooled to 0° C., and 282.2 g (0.49 mol) of bisphenol A bistrimellitate dianhydride was added thereto at this temperature. Subsequently, stirring was continued at room temperature for 20 min and at 60° C. for 2 hours, the mixture was then heated to 180° C., and a reaction was carried out for 5 hours so as to complete imidization. The reaction mixture thus obtained was poured into methanol so as to isolate a polymer. This polymer was dried and then dissolved in N-methyl-2-pyrrolidone, and the solution was poured into methanol so as to isolate the polymer again. Subsequently, the polymer was dried under vacuum to give a purified polyetherimide powder. 120 g of the polyetherimide powder thus obtained was dissolved in 360 g of N-methyl-2-pyrrolidone to give an aromatic polyetherimide adhesive varnish.

Production Example 7

Production of Aromatic Polyetheramideimide Adhesive Varnish for Use in Examples 11 and 12

A 5 L four-necked flask equipped with a thermometer, a stirrer, a nitrogen inlet, and a fractionating column was charged under an atmosphere of nitrogen with 250.9 g (0.58 mol) of bis[4-(4-aminophenoxy)phenyl]sulfone and 7.4 g (0.03 mol) of 1,3-bis(3-aminopropyl)tetramethyldisiloxane, which were then dissolved in 1500 g of N-methyl-2-pyrrolidone. This solution was then cooled to 0° C., and 126.3 g (0.6 mol) of trimellitic anhydride chloride was added thereto at this temperature. When the trimellitic anhydride chloride dissolved, 67 g of triethylamine was added. Stirring was continued at room temperature for 2 hours, the mixture was then heated to 180° C., and a reaction was carried out for 5 hours so as to complete imidization. The reaction mixture thus obtained was poured into methanol so as to isolate a polymer. This polymer was dried and then dissolved in N-methyl-2-pyrrolidone, and the solution was poured into methanol so as to isolate the polymer again. Subsequently, the polymer was dried under vacuum to give a purified polyetheramideimide powder. 120 g of the polyetheramideimide powder thus obtained and 6.0 g of a silane coupling agent (product name: SH6040, manufactured by Shin-Etsu Chemical Co., Ltd.) were dissolved in 360 g of N-methyl-2-pyrrolidone to give an aromatic polyetheramideimide adhesive varnish.

Production Example 8

Production of Polysiloxane Polyamide Block Copolymer Adhesive Varnish for Use in Comparative Example 1

A 5 L four-necked flask equipped with a thermometer, a stirrer, a nitrogen inlet, and a fractionating column was charged under an atmosphere of nitrogen with 295.2 g (0.72 mol) of 2,2-bis[4-(4-aminophenoxy)phenyl]propane and 540 g (0.18 mol) of a silicone diamine (product name: X-22-161B, manufactured by Shin-Etsu Chemical Co., Ltd.), which were then dissolved in 2400 g of diethylene glycol dimethyl ether. This solution was then cooled to −10° C., and 188.8 g (0.93 mol) of isophthalic acid chloride was added thereto at this temperature. Subsequently, after stirring for 1 hour, 214 g of propylene oxide was then added thereto. Stirring was further continued at room temperature for 30 min, the mixture was heated to 40° C., and a reaction was carried out for 5 hours. The reaction mixture thus obtained was poured into methanol so as to isolate a polymer. This polymer was dried, then dissolved in dimethylformamide, and poured into methanol so as to isolate the polymer again. The polymer was subsequently dried under vacuum to give a purified polysiloxane polyamide block copolymer powder. 120 g of the resin powder thus obtained and 6.0 g of a silane coupling agent (product name: SH6040, manufactured by Shin-Etsu Chemical Co., Ltd.) were dissolved in 360 g of N-methyl-2-pyrrolidone to give a polysiloxane polyamide block copolymer adhesive varnish.

Production Example 9

Production of Aromatic Polyetheramideimide Adhesive Varnish for Use in Comparative Example 3

A 5 L four-necked flask equipped with a thermometer, a stirrer, a nitrogen inlet, and a fractionating column was charged under an atmosphere of nitrogen with 259.6 g (0.60 mol) of bis[4-(4-aminophenoxy)phenyl]sulfone, which was then dissolved in 1500 g of N-methyl-2-pyrrolidone. This solution was then cooled to 0° C., and 126.3 g (0.6 mol) of trimellitic anhydride chloride was added thereto at this temperature. When the trimellitic anhydride chloride dissolved, 67 g of triethylamine was added. Stirring was continued at room temperature for 2 hours, the mixture was then heated to 180° C., and a reaction was carried out for 5 hours so as to complete imidization. The reaction mixture thus obtained was poured into methanol so as to isolate a polymer. This polymer was dried and then dissolved in N-methyl-2-pyrrolidone, and the solution was poured into methanol so as to isolate the polymer again. Subsequently, the polymer was dried under vacuum to give a purified polyetheramideimide powder. 120 g of the polyetheramideimide powder thus obtained and 6.0 g of a silane coupling agent (product name: SH6040, manufactured by Shin-Etsu Chemical Co., Ltd.) were dissolved in 360 g of N-methyl-2-pyrrolidone to give an aromatic polyetheramideimide adhesive varnish.

Example 1

Figure 1:
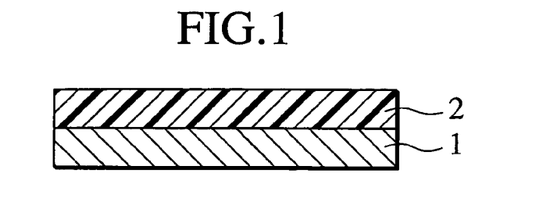
FIG. 1 is a sectional view of an adhesive film for semiconductor use of one embodiment of the present invention.

A 125 μm thick polyimide film having a surface thereof subjected to a chemical treatment (Upilex SGA, manufactured by Ube Industries, Ltd.) was used as the support film. The aromatic polyetheramideimide adhesive varnish produced in Production Example 1 was cast on one side of this polyimide film at a thickness of 90 μm and dried at 100° C. for 10 min and at 300° C. for 10 min to give an adhesive film for semiconductor use having the configuration shown in FIG. 1, in which there was a 25 μm thick resin layer A 2 on one side of the support film 1. The resin layer A had a glass transition temperature of 195° C., a 5 wt % loss temperature of 421° C., and a elastic modulus at 230° C. of 7 MPa. The thickness ratio (A/B) of the thickness (A) of the resin layer A 2 to the thickness (B) of the support film 1 was 0.2.

Subsequently, this adhesive film was laminated to a 10 μm thick rolled copper foil at 250° C. with a pressure of 8 MPa for 10 sec. The 90 degree peel strength (peel speed: 300 mm/min, the same applies below) between the resin layer A and the copper foil measured at 25° C. was 150 N/m, and there was no problem of peeling during transport. The adhesive film for semiconductor use had little curl, and the workability during laminating was excellent.

Figure 2:
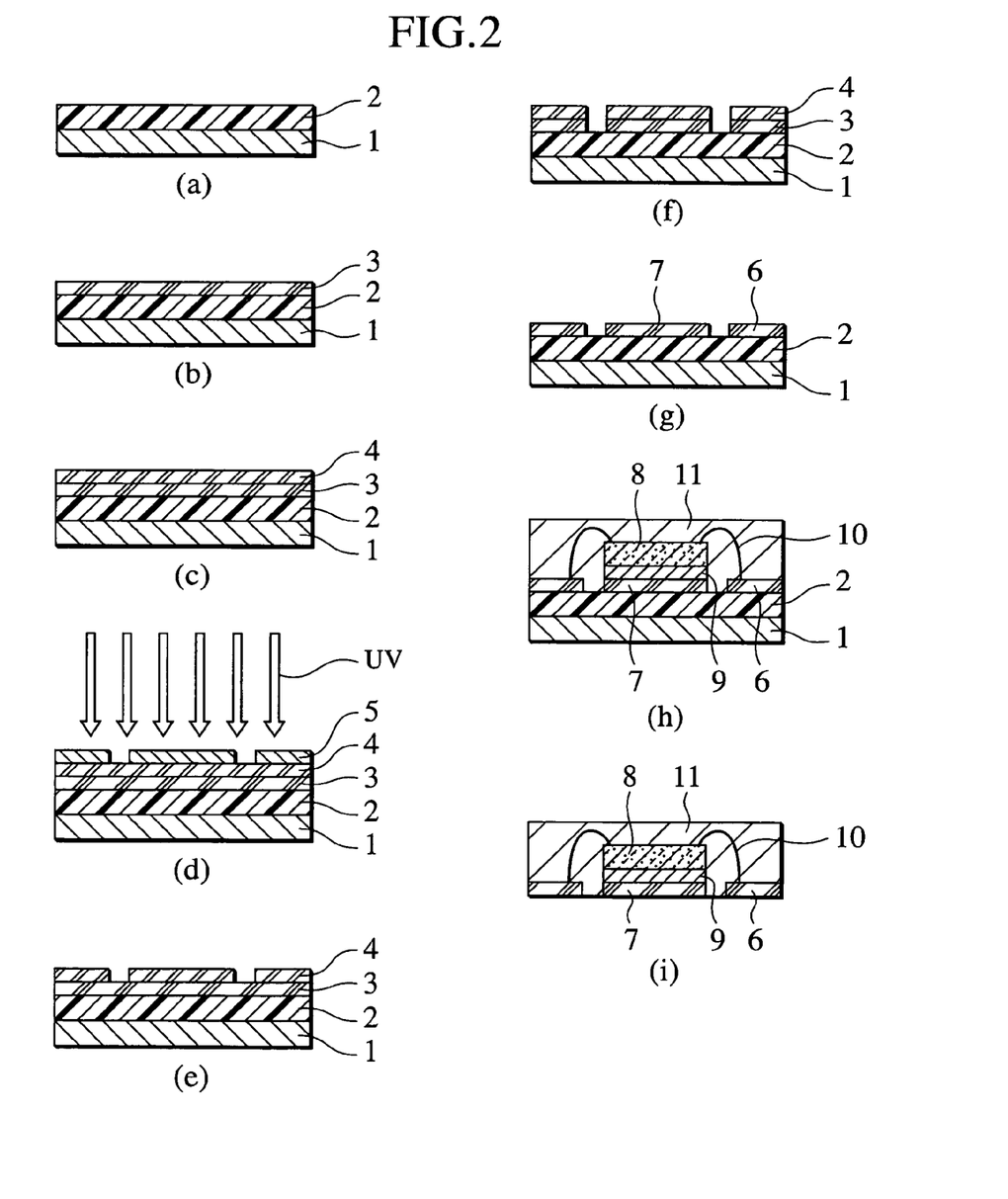
FIG. 2 shows explanatory sectional views of steps for producing a semiconductor device using the adhesive film for semiconductor use of the present invention.

FIG. 2 shows steps of producing a semiconductor device using this adhesive film for semiconductor use. As shown in FIG. 2 (*a*) and (*b*), a copper foil 3 was laminated to the resin layer A of the adhesive film for semiconductor use, as shown in FIG. 2 (*c*), (*d*), (*e*), (*f*), and (*g*), after a light-sensitive film 4 was laminated to the side of the copper foil opposite to the adhesive film for semiconductor use, a wiring circuit mask 5 was superimposed thereon, it was exposed to UV light, and after the light-sensitive film 4 was developed, etching was carried out using a ferric chloride solution to give a wiring circuit having an inner lead 6 and a die pad 7. In the step of processing the metal sheet to give the wiring circuit, there were no problems such as circuit formation defects due to penetration of the etching solution or the circuit peeling off in a washing step or a transporting step.

A semiconductor die 8 was bonded to the die pad 7 of the wiring circuit obtained above as shown in FIG. 2 (*h*) using a die bonding material 9, the semiconductor die 8 and the inner lead 6 were wire bonded using a wire 10, and the wiring circuit, the semiconductor die, and the wire were molded using a molding compound 11 to give a package. The package thus obtained had the structure shown in FIG. 3 (silver paste (die bonding material 9) not illustrated) in which a plurality of the packages shown in FIG. 2 (h) were joined. In the FIGS. 6 and 7 are both parts of the wiring circuit obtained by processing the metal sheet (in this example, the copper foil). The semiconductor die was bonded using a silver paste, and the silver paste was hardened by heating it at 150° C. for 60 min. The wire bonding was carried out using gold wire as the wire by the combined use of ultrasound and heating at 230° C. The molding step was carried out using as the molding compound a biphenyl molding compound (product name: CEL9200, manufactured by Hitachi Chemical Co., Ltd.) at 180° C. with a pressure of 10 MPa for 3 min, followed by heating at 180° C. for 5 hours so as to harden the molding resin. No problems occurred in any of the steps. After the molding step, as shown in FIG. 2 (i), the adhesive film for semiconductor use 12 was peeled off from the wiring circuit and the molding compound at 235° C. (peel speed: 300 mm/min, the same applies below). The 90 degree peel strength was 350 N/m, peeling was easy, and there was hardly any resin residue on the wiring circuit or the molding resin. A very small amount of resin residue was removed by washing with N-methyl-2-pyrrolidone.

Furthermore, this package was subjected to dicing so as to divide it and give packages each having one semiconductor die, and no problems occurred during this step.

Example 2

An adhesive film for semiconductor use was prepared in the same manner as in Example 1 except that a 50 μm thick polyimide film having a surface thereof subjected to a chemical treatment (Upilex SGA, manufactured by Ube Industries, Ltd.) was used as the support film. The thickness ratio (A/B) of the thickness (A) of the resin layer A to the thickness (B) of the support film was 0.5. The adhesive film was subsequently laminated to a 10 μm thick rolled copper foil at 250° C. with a pressure of 8 MPa for 10 sec; the 90 degree peel strength between the resin layer A and the metal sheet measured at 25° C. was 170 N/m, and there was no problem of peeling during transport. The adhesive film for semiconductor use had little curl, and the workability during laminating was excellent. Furthermore, a package having the structure shown in FIG. 3 was fabricated using this copper foil with the adhesive film for semiconductor use laminated thereto in the same manner as in Example 1 by carrying out metal sheet processing, bonding of a semiconductor die to a wiring circuit, a wire bonding step, and a molding step, and no problems occurred in any of the steps. After the molding step, the adhesive film for semiconductor use was peeled off from the wiring circuit and the molding compound at 235° C.; the 90 degree peel strength was 330 N/m, and peeling was easy. There was hardly any resin residue on the wiring circuit or the molding compound.

Example 3

An adhesive film for semiconductor use was prepared in the same manner as in Example 1 except that a 25 μm thick polyimide film having a surface thereof subjected to a chemical treatment (Upilex SGA, manufactured by Ube Industries, Ltd.) was used as the support film. The thickness ratio (A/B) of the thickness (A) of the resin layer A to the thickness (B) of the support film was 1.0. The adhesive film was then laminated to a 10 μm thick rolled copper foil at 250° C. with a pressure of 8 MPa for 10 sec; the 90 degree peel strength between the resin layer A and the metal sheet measured at 25° C. was 170 N/m, and there was no problem of peeling during transport. Although the adhesive film for semiconductor use had rather a large amount of curl, the workability during laminating was excellent. Furthermore, a package having the structure shown in FIG. 3 was fabricated using this copper foil with the adhesive film for semiconductor use laminated thereto in the same manner as in Example 1 by carrying out metal sheet processing, bonding of a semiconductor die to a wiring circuit, a wire bonding step, a molding step, and cutting, and no problems occurred in any of the steps. After the molding step, the 90 degree peel strength when peeling the adhesive film from the wiring circuit and the molding compound at 235° C. was 300 N/m, and peeling was easy. Furthermore, there was hardly any resin residue on the wiring circuit or the molding compound.

Example 4

An adhesive film for semiconductor use was prepared in the same manner as in Example 1 except that a 25 μm thick polyimide film having a surface thereof subjected to a plasma treatment (Upilex SPA, manufactured by Ube Industries, Ltd.) was used as the support film. The thickness ratio (A/B) of the thickness (A) of the resin layer A to the thickness (B) of the support film was 1.0. The film was then laminated to a 70 μm thick rolled copper foil at 250° C. with a pressure of 8 MPa for 10 sec. The 90 degree peel strength between the resin layer A and the metal sheet measured at 25° C. was 170 N/m, and there was no problem of peeling during transport. The adhesive film for semiconductor use had little curl, and the workability during laminating was excellent. Furthermore, a package having the structure shown in FIG. 3 was fabricated using this copper foil with the adhesive film for semiconductor use laminated thereto in the same manner as in Example 1 by carrying out metal sheet processing, bonding of a semiconductor die to a wiring circuit, a wire bonding step, and a molding step, and no problems occurred in any of the steps. After the molding step, the adhesive film was peeled off from the wiring circuit and the molding compound at 235° C.; the 90 degree peel strength was 300 N/m, and peeling was easy. Moreover, there was hardly any resin residue on the wiring circuit or the molding compound.

Example 5

Figure 4:
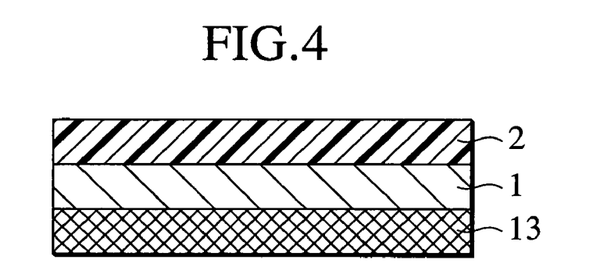
FIG. 4 is a sectional view of an adhesive film for semiconductor use of one embodiment of the present invention.

A 25 μm thick polyimide film having a surface thereof subjected to a plasma treatment (Upilex SPA, manufactured by Ube Industries, Ltd.)) was used as the support film. The aromatic polyetheramideimide adhesive varnish produced in Production Example 2 was cast on one side of this polyimide film at a thickness of 50 μm and dried at 100° C. for 10 min and at 300° C. for 10 min to give a 10 μm thick resin layer A. This resin layer A had a glass transition temperature of 187° C., a 5% weight loss temperature of 429° C., and a elastic modulus at 230° C. of 5 MPa. Furthermore, the aromatic polyetheramideimide resin varnish produced in Production Example 3 was cast on the opposite side of the polyimide film at a thickness of 50 μm and dried at 100° C. for 10 min and at 300° C. for 10 min to give a 10 μm thick resin layer B. This resin layer B had a glass transition temperature of 260° C., a 5% weight loss temperature of 421° C., and a elastic modulus at 230° C. of 1700 MPa. In this way, an adhesive film for semiconductor use having a resin layer A 2 and a resin layer B 13 coated on each side of the support film 1 as shown in FIG. 4 was obtained.

After the adhesive film was laminated to a 10 μm thick rolled copper foil at 250° C. with a pressure of 8 MPa for 10 sec, the 90 degree peel strength at 25° C. between the adhesive film and the metal sheet was 130 N/m, and there was no problem of peeling during transport. The adhesive film for semiconductor use had little curl, and the workability during laminating was excellent. Furthermore, a package having the structure shown in FIG. 3 was fabricated using this copper foil with the adhesive film for semiconductor use laminated thereto in the same manner as in Example 1 by carrying out metal sheet processing, bonding of a semiconductor die to a wiring circuit, a wire bonding step, and a molding step, and no problems occurred in any of the steps. After the molding step, the 90 degree peel strength when the adhesive film was peeled off from the wiring circuit and the molding compound at 205° C. was 280 N/m, and peeling was easy. Moreover, there was hardly any resin residue on the wiring circuit or the molding compound.

Example 6

A 25 µm thick polyimide film having a surface thereof subjected to a chemical treatment (Upilex SGA, manufactured by Ube Industries, Ltd.) was used as the support film. The aromatic polyetheramideimide adhesive varnish produced in Production Example 2 was cast on one side of this polyimide film at a thickness of 50 µm, and dried at 100° C. for 10 min and at 300° C. for 10 min to give a 10 µm thick resin layer A. This resin layer A had a glass transition temperature of 187° C., a 5% weight loss temperature of 429° C., and a elastic modulus at 230° C. of 5 MPa. Furthermore, a resin varnish formed by mixing the aromatic polyetheramideimide powder having a glass transition temperature of 230° C. produced in Production Example 4 and bis(4-maleimidephenyl) methane at a ratio by weight of 6/4 (former/latter) was cast on the opposite side of the polyimide film at a thickness of 50 µm, and dried at 100° C. for 10 min and at 300° C. for 10 min to give a 10 µm thick resin layer B. The elastic modulus at 230° C. of the resin layer B was 500 MPa. In this way, as shown in FIG. 4, an adhesive film for semiconductor use having the resin layer A 2 and the resin layer B 13 applied to each side of the support film 1 was obtained. After the adhesive film was laminated to a 10 µm thick rolled copper foil at 250° C. with a pressure of 8 MPa for 10 sec, the 90 degree peel strength between the resin layer A and the metal sheet measured at 25° C. was 130 N/m, and there was no problem of peeling during transport. The adhesive film for semiconductor use had little curl, and the workability during laminating was excellent. Furthermore, a package having the structure shown in FIG. 3 was fabricated using this copper foil with the adhesive film for semiconductor use laminated thereto in the same manner as in Example 1 by carrying out metal sheet processing, bonding of a semiconductor die to a wiring circuit, a wire bonding step, and a molding step, and no problems occurred in any of the steps. After the molding step, the 90 degree peel strength when the adhesive film was peeled off from the wiring circuit and the molding compound at 205° C. was 280 N/m, and peeling was easy. Moreover, there was hardly any resin residue on the wiring circuit or the molding compound.

Example 7

An adhesive film for semiconductor use was prepared in the same manner as in Example 1 except that a 125 µm thick polyethylene naphthalate film (product name: TEONEX, manufactured by Teijin Ltd.) was used as the support film instead of the 125 µm thick polyimide film having the surface thereof subjected to a chemical treatment (Upilex SGA, manufactured by Ube Industries, Ltd.). The thickness ratio (A/B) of the thickness (A) of the resin layer A to the thickness (B) of the support film was 0.2. The adhesive film was then laminated to a 10 µm thick rolled copper foil at 250° C. with a pressure of 8 MPa for 10 sec. The 90 degree peel strength between the resin layer A and the metal sheet measured at 25° C. was 150 N/m, and there was no problem of peeling during transport. Although the adhesive film for semiconductor use had rather a large amount of curl, the workability during laminating was excellent. Furthermore, a package having the structure shown in FIG. 3 was fabricated using this copper foil with the adhesive film for semiconductor use laminated thereto in the same manner as in Example 1 by carrying out metal sheet processing, bonding of a semiconductor die to a wiring circuit, a wire bonding step, and a molding step, and no problems occurred in any of the steps. After the molding step, the 90 degree peel strength when the adhesive film was peeled off from the wiring circuit and the molding compound at 235° C. was 350 N/m, and peeling was easy. Moreover, there was hardly any resin residue on the wiring circuit or the molding compound.

Example 8

An adhesive film for semiconductor use was prepared in the same manner as in Example 1 except that a 25 µm thick polyimide film having a surface thereof subjected to a chemical treatment (Upilex SGA, manufactured by Ube Industries, Ltd.) was used as the support film, and the adhesive film was laminated to a 150 µm thick 42 alloy sheet at 350° C. with a pressure of 3 MPa for 3 sec. The 90 degree peel strength between the resin layer A and the metal sheet measured at 25° C. was 900 N/m, and there was no problem of peeling during transport. The adhesive film for semiconductor use had little curl, and the workability during laminating was excellent. Furthermore, a package having the structure shown in FIG. 3 was fabricated using the metal sheet with the adhesive film for semiconductor use laminated thereto by carrying out metal sheet processing, bonding of a semiconductor die to a wiring circuit, a wire bonding step, and a molding step, and no problems occurred in any of the steps. After the molding step, the 90 degree peel strength when the adhesive film was peeled off from the wiring circuit and the molding compound at 235° C. was 220 N/m and peeling was easy. Moreover, there was hardly any resin residue on the wiring circuit or the molding compound.

Example 9

An adhesive film for semiconductor use was prepared in the same manner as in Example 1 except that the aromatic polyetheramideimide adhesive varnish produced in Production Example 5 was used for formation of a resin layer A. The resin layer A had a glass transition temperature of 230° C., a wt % loss temperature of 451° C., and a elastic modulus at 230° C. of 150 MPa. The adhesive film was then laminated to a 35 µm thick electrolytic copper foil at 250° C. with a pressure of 8 MPa for 10 sec. The 90 degree peel strength at 25° C. between the resin layer A and the copper foil after laminating was 70 N/m, and there was no problem of peeling during transport. The adhesive film for semiconductor use had little curl, and the workability during laminating was excellent. Furthermore, a package having the structure shown in FIG. 3 was fabricated using this copper foil with the adhesive film for semiconductor use laminated thereto in the same manner as in Example 1 by carrying out processing of the metal sheet to give a wiring circuit, subjecting the wiring circuit to gold plating, then bonding of a semiconductor die, a wire bonding step, and a molding step, and no problems occurred in any of the steps. After the molding step, the 90 degree peel strength when the adhesive film for semiconductor use was peeled off from the wiring circuit and the molding compound at 205° C. was 300 N/m, and peeling was easy. Moreover, there was hardly any resin residue on the wiring circuit or the molding compound.

Example 10

An adhesive film for semiconductor use was prepared in the same manner as in Example 1 except that the aromatic polyetherimide adhesive varnish produced in Production Example 6 was used for formation of a resin layer A. The resin layer A had a glass transition temperature of 240° C., a 5% weight loss temperature of 410° C., and a elastic modulus at 230° C. of 300 MPa. The adhesive film for semiconductor use was then laminated to an 18 μm thick electrolytic copper foil at 250° C. with a pressure of 8 MPa for 10 sec. The 90 degree peel strength at 25° C. between the resin layer A and the copper foil after the laminating was 50 N/m, and there was no problem of peeling during transport. The adhesive film for semiconductor use had little curl, and the workability during laminating was excellent. Furthermore, a package having the structure shown in FIG. 3 was fabricated using this copper foil with the adhesive film for semiconductor use laminated thereto in the same manner as in Example 1 by carrying out metal sheet processing, bonding of a semiconductor die to a wiring circuit, a wire bonding step, and a molding step, and no problems occurred in any of the steps. After the molding step, that the 90 degree peel strength when the adhesive film for semiconductor use was peeled off from the wiring circuit and the molding compound at 235° C. was 500 N/m and peeling was easy. Moreover, there was hardly any resin residue on the wiring circuit or the molding compound.

Example 11

A 25 μm thick polyimide film having a surface thereof subjected to a sand matte treatment (product name: Kapton EN, manufactured by Du Pont-Toray Co., Ltd., coefficient of linear thermal expansion at 20° C. to 200° C. of 15×10$^{-5}$/° C., thermal shrinkage ratio when heated at 200° C. for 2 hours of 0.02%) was used as the support film. The aromatic polyetheramideimide adhesive varnish produced in Production Example 7 was cast on one side of this polyimide film at a thickness of 25 μm and dried at 100° C. for 10 min and at 300° C. for 10 min to give an adhesive film for semiconductor use having the configuration shown in FIG. 1 in which a 4 μm thick resin layer A was attached to one side of the support film. This resin layer A had a glass transition temperature of 260° C., a 5% weight loss temperature of 430° C., and a elastic modulus at 230° C. of 1500 MPa.

The adhesive film for semiconductor use was then laminated to a 10 μm thick rolled copper foil at 280° C. with a pressure of 6 MPa for 10 sec. The 90 degree peel strength between the resin layer A and the copper foil after laminating measured at 25° C. was 30 N/m, and there was no problem of peeling during transport. The adhesive film for semiconductor use had little curl, and the workability during laminating was excellent.

Furthermore, when a wiring circuit was obtained using this copper foil with the adhesive film for semiconductor use laminated thereto by carrying out processing of the metal sheet, it was observed that an etching solution penetrated into the interface with the adhesive film to a slight extent, and when water flow was too high in a washing step, there was a case in which part almost peeled off, but this could be avoided by optimizing the conditions. Subsequently, a step of bonding a semiconductor die to a die pad was carried out. During this process, in order to harden a silver paste used for bonding, heating was carried out at 150° C. for 90 min, and after that the 90 degree peel strength between the copper foil and the resin layer A at 25° C. was 50 N/m.

Furthermore, wire bonding was carried out using the wiring circuit laminated with the adhesive film having the semiconductor die bonded thereto. During this process, after wire bonding was carried out at 260° C., the 90 degree peel strength between the copper foil and the resin layer A measured at 25° C. was 70 N/m.

Figure 3:
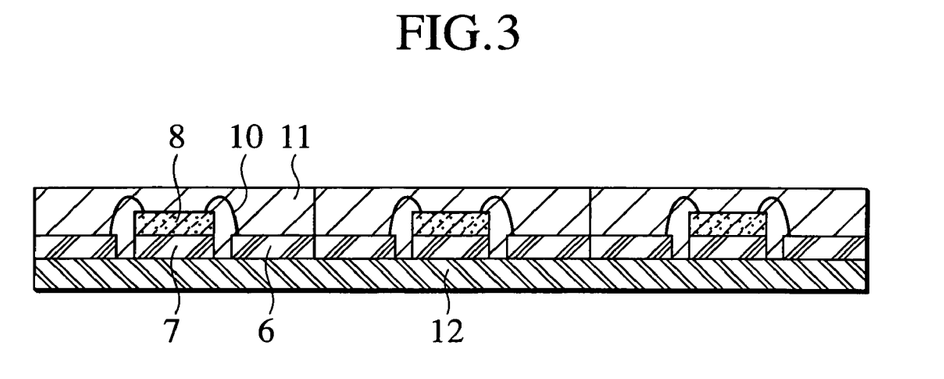
FIG. 3 is a sectional view showing a semiconductor device laminated with an adhesive film for semiconductor use of one embodiment of the present invention.

A package having the structure shown in FIG. 3 was fabricated using this wiring circuit laminated with the adhesive film in the same manner as in Example 1 by carrying out a molding step, and no problems, such as a molding compound entering between the wiring circuit and the resin layer A during the molding step, were found. After the molding step, the 90 degree peel strength when the adhesive film for semiconductor use was peeled off from the wiring circuit and the molding compound at 175° C. was 100 N/m, and peeling was easy.

Example 12

Figure 5:
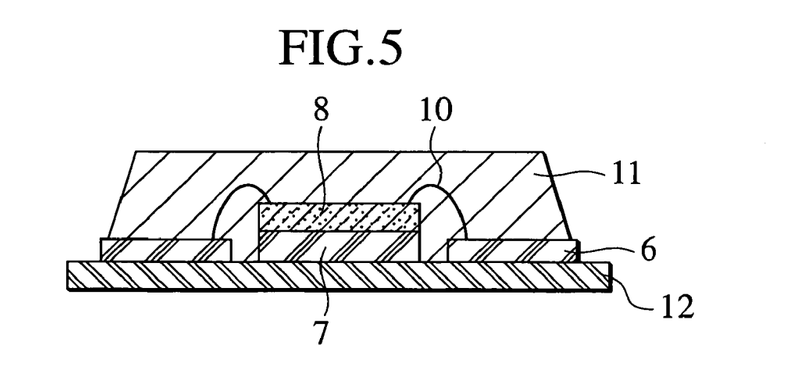
FIG. 5 is a sectional view showing a semiconductor device laminated with an adhesive film for semiconductor use of one embodiment of the present invention.

A package having the structure shown in FIG. 5, in which a plurality of packages were joined, was fabricated in the same manner as in Example 11 by carrying out formation of an adhesive film for semiconductor use, laminating to a 35 μm thick rolled copper foil, formation of different wiring circuits, gold plating of the wiring circuits, then bonding of semiconductor dies, a wire bonding step, and a molding step, and no problems occurred in any of the steps. After the molding step, the 90 degree peel strength when the adhesive film for semiconductor use was peeled off from the wiring circuit and the molding compound at 175° C. was 90 N/m, and peeling was easy. Moreover, there was hardly any adhesive residue on the wiring circuit or the molding compound. Furthermore, this package having the structure in which the plurality of packages were joined was divided to give the package shown in FIG. 5, and there were no problems during any of the steps.

Comparative Example 1

A 125 μm thick polyimide film having a surface thereof subjected to a chemical treatment (Upilex SGA, manufactured by Ube Industries, Ltd.) was used as the support film. The polysiloxane polyamide block copolymer adhesive varnish produced in Production Example 8 was cast on one side of this support film at a thickness of 90 μm, and dried at 100° C. for 10 min and at 300° C. for 10 min to give an adhesive film for semiconductor use having the configuration shown in FIG. 1 in which a 25 μm thick resin layer A 2 was attached to one side of the support film 1. This resin layer A had a glass transition temperature of 182° C., a 5% weight loss temperature of 380° C., and a elastic modulus at 230° C. of less than 1 MPa. The thickness ratio (A/B) of the thickness (A) of the resin layer A to the thickness (B) of the support film was 0.2. This adhesive film for semiconductor use was then laminated to a 12 μm thick rolled copper foil at 250° C. with a pressure of 8 MPa for 10 sec. The 90 degree peel strength between the copper foil and the resin layer A measured at 25° C. was 0 N/m, they were peeled apart during transport, and the subsequent steps could not be carried out.

Comparative Example 2

A 125 μm thick polyimide film having a surface thereof subjected to a chemical treatment (Upilex SGA, manufactured by Ube Industries, Ltd.) was used as the support film. A phenol resin-based adhesive varnish was cast on one side of this support film at a thickness of 80 μm and dried at 100° C. for 10 min and at 150° C. for 10 min to give an adhesive film for semiconductor use having the configuration shown in FIG. 1 in which a 25 μm thick resin layer A 2 was attached to one side of the support film 1. This resin layer A had a glass transition temperature of 180° C., a 5% weight loss temperature of 280° C., and a elastic modulus at 230° C. of 10 MPa. The thickness ratio (A/B) of the thickness (A) of the resin layer A to the thickness (B) of the support film was 0.2.

The adhesive film for semiconductor use was then laminated to a 12 μm thick rolled copper foil at 250° C. with a pressure of 8 MPa for 10 sec, the 90 degree peel strength between the copper foil and the resin layer A measured at 25° C. was 400 N/m, and there was no problem of peeling during transport. The adhesive film for semiconductor use had little curl, and the workability during laminating was excellent. However, when metal sheet processing, bonding of a semiconductor die to a wiring circuit, and a wire bonding step were carried out using this copper foil with the adhesive film for semiconductor use laminated thereto in the same manner as in Example 1, outgassing occurred during the wire bonding step, thus causing the problem of contamination of the wire.

After a package having the structure shown in FIG. 3 was fabricated by carrying out a molding step, the 90 degree peel strength when the adhesive film for semiconductor use was peeled off from the wiring circuit and the molding compound at 190° C. was 1300 N/m, and part of the molding compound was fractured. Furthermore, there was a large amount of resin residue on the wiring circuit and the molding compound, and it was difficult to remove the resin residue even by washing with N-methyl-2-pyrrolidone.

Comparative Example 3

A 25 μm thick polyimide film having a surface thereof subjected to a sand matte treatment (product name: Kapton EN, manufactured by Du Pont-Toray Co., Ltd., coefficient of linear thermal expansion at 20° C. to 200° C. of 15×10$^{-5}$/° C., thermal shrinkage ratio when heated at 200° C. for 2 hours of 0.02%) was used as the support film. The aromatic polyetheramideimide adhesive varnish produced in Production Example 9 was cast on one side of this polyimide film at a thickness of 25 μm and dried at 100° C. for 10 min and at 300° C. for 10 min to give an adhesive film for semiconductor use having the configuration shown in FIG. 1 in which a 4 μm thick resin layer A was attached to one side of the support film. This resin layer A had a glass transition temperature of 270° C., a 5% weight loss temperature of 440° C., and a elastic modulus at 230° C. of 1700 MPa.

The adhesive film for semiconductor use was then laminated to a 10 μm thick rolled copper foil at 280° C. with a pressure of 6 MPa for 10 sec. After laminating, the 90 degree peel strength between the resin layer A and the copper foil measured at 25° C. was 5 N/m.

When this copper foil with the adhesive film for semiconductor use laminated thereto was processed to give a wiring circuit, it was observed that an etching solution penetrated into the interface with the adhesive film, and the circuit was broken in some parts. Furthermore, since a considerable amount of peeling of the circuit occurred during a washing step, the subsequent step could not be carried out.

It can be seen from the results of Examples 1 to 12 and Comparative Examples 1 to 3 that, in accordance with the use of an adhesive film for semiconductor use that has a 90 degree peel strength at 25° C. from a metal sheet, prior to processing of the metal sheet to give a wiring circuit, of 20 N/m or greater, and 90 degree peel strengths from the wiring circuit and a molding compound at at least one point in the temperature range of 0° C. to 250° C. after resin molding of 1000 N/m or less, and that can be peeled from the wiring circuit and the molding compound, a semiconductor package can be produced with high workability and productivity without causing problems in any of the steps, including the metal sheet processing step.

The invention claimed is:

1. A method for producing a semiconductor device, the method comprising:
    (a) a step of laminating directly to one side of a metal sheet an adhesive film for semiconductor use,
    (b) a step of processing the metal sheet to give a wiring circuit,
    (c) a step of electrically connecting a semiconductor die onto an exposed surface of the wiring circuit,
    (d) a step of molding the semiconductor die and the exposed surface of the wiring circuit with a molding compound, and
    (e) a step of peeling off the adhesive film for semiconductor use from the wiring circuit and the molding compound,
    wherein said adhesive film for semiconductor use comprises a support film and a resin layer A formed on one side or both sides of the support film, the 90 degree peel strength between the resin layer A and the metal sheet prior to the processing of the metal sheet laminated with the adhesive film for semiconductor use to give the wiring circuit being 20 N/m or greater at 25° C., and the 90 degree peel strengths, after molding with the molding compound the wiring circuit laminated with the adhesive film for semiconductor use, between the resin layer A and the wiring circuit and between the resin layer A and the molding compound, both being 1000N/m or less at at least one point in the temperature range of 0° C. to 250° C., and
    wherein the resin layer A, which has adhesion, is formed on one side of the support film, and a resin layer B having no adhesion and an elastic modulus at 230° C. of 10 MPa or greater is formed on the opposite side thereof.

2. The method according to claim 1, wherein the 90 degree peel strengths between the resin layer A and the wiring circuit and between the resin layer A and the molding compound after molding with the molding compound are both 1000 N/m or less at at least one point in the temperature range of 100° C. to 250° C.

3. The method according to claim 1, wherein the 90 degree peel strengths between the resin layer A and the wiring circuit and between the resin layer A and the molding compound are both 1000 N/m or less at a temperature at which, after molding with the molding compound, the adhesive film for semiconductor use is peeled off from the wiring circuit and the molding compound.

4. The method according to claim 1, wherein the resin layer A has a glass transition temperature of 100° C. to 300° C.

5. The method according to claim 1, wherein the temperature at which the resin layer A shows a 5 wt % loss is 300° C. or greater.

6. The method according to claim 1, wherein the resin layer A has a elastic modulus at 230° C. of 1 MPa or greater.

7. The method according to claim 1, wherein the resin layer A comprises a thermoplastic resin having an amide group, an ester group, an imide group, an ether group, or a sulfone group.

8. The method according to claim 1, wherein the resin layer A comprises a thermoplastic resin having an amide group, an ester group, an imide group, or an ether group.

9. The method according to claim 1, wherein the material of the support film is selected from the group consisting of an aromatic polyimide, an aromatic polyamide, an aromatic polyamideimide, an aromatic polysulfone, an aromatic polyethersulfone, a polyphenylene sulfide, an aromatic polyetherketone, a polyarylate, an aromatic polyetheretherketone, and a polyethylene naphthalate.

10. The method according to claim 1, wherein the ratio (A/B) of the thickness (A) of the resin layer A to the thickness (B) of the support film is 0.5 or less.

11. The method according to claim 1, wherein the thickness of the adhesive film is 200 μm or less.

12. The method according to claim 1, wherein the wiring circuit comprises a plurality of patterns each having a die pad and an inner lead, and the method comprises, after the molding step or after the step of peeling off the adhesive film for semiconductor use, a step of dividing the molded wiring circuit laminated with the adhesive film to give a plurality of semiconductor devices each having one semiconductor die.

13. The method according to claim 12, wherein the step of electrically connecting the semiconductor die onto an exposed surface of the wiring circuit includes bonding the semiconductor die to the die pad and wire bonding the semiconductor die and the inner lead with wires.

14. The method according to claim 11, wherein the step of peeling off the adhesive film is performed at a temperature in a range of 0° C. to 250° C.

15. The method according to claim 1, wherein said 90 degree peel strength between the resin layer A and the metal sheet prior to the processing of the metal sheet for semiconductor use to give the wiring circuit is no more than 2000N/m at 25° C.

16. The method according to claim 1, wherein said 90 degree peel strength between the resin layer A and the metal sheet prior to the processing of the metal sheet for semiconductor use to give the wiring circuit is 150N/m or greater at 25° C.

17. The method according to claim 1, wherein said 90 degree peel strength between the resin layer A and the metal sheet prior to the processing of the metal sheet for semiconductor use to give the wiring circuit is 70N/m or greater at 25° C.

18. The method according to claim 1, wherein the 90 degree peel strength at 25° C. between the resin layer A and the wiring circuit immediately before carrying out the molding step is 5N/m or greater.

19. The method according to claim 18, wherein the 90 degree peel strength at 25° C. between the resin layer A and the wiring circuit immediately before carrying out the molding step is 50N/m or greater.

20. The method according to claim 1, including the further step of heating prior to the molding step so as to increase adhesive strength between the resin layer A and the wiring circuit.

21. The method according to claim 1, wherein the 90 degree peel strengths between the resin layer A and the wiring circuit and between the resin layer A and the molding compound both are no more than 500N/m at at least one point in the temperature range of 0° C. to 250° C.

22. The method according to claim 1, wherein the 90 degree peel strengths between the resin layer A and the wiring circuit and between the resin layer A and the molding compound both are 3N/m or greater at at least one point in the temperature range of 0° C. to 250° C.

23. The method according to claim 1, wherein the 90 degree peel strengths between the resin layer A and the wiring circuit and between the resin layer A and the molding compound both are no more than 800N/m at at least one point in the temperature range of 0° C. to 250° C.

24. The method according to claim 1, wherein the resin layer A is a thermoplastic resin selected from the group consisting of aromatic polyamide, aromatic polyester, aromatic polyimide, aromatic polyamideimide, aromatic polyether, aromatic polyetheramideimide, aromatic polyetheramide, aromatic polyesterimide, and aromatic polyetherimide.

25. The method according to claim 1, wherein the resin layer A is a thermoplastic resin selected from the group consisting of aromatic polyetheramideimide, aromatic polyetherimide and aromatic polyetheramide.

26. A method for producing a semiconductor device, the method comprising:
(a) a step of laminating to one side of a metal sheet an adhesive film for semiconductor use,
(b) a step of processing the metal sheet to give a wiring circuit,
(c) a step of electrically connecting a semiconductor die onto an exposed surface of the wiring circuit,
(d) a step of molding the semiconductor die and the exposed surface of the wiring circuit with a molding compound, and
(e) a step of peeling off the adhesive film for semiconductor use from the wiring circuit and the molding compound,
wherein said adhesive film for semiconductor use comprises a support film and a resin layer A formed on one side or both sides of the support film, the 90 degree peel strength between the resin layer A and the metal sheet prior to the processing of the metal sheet laminated with the adhesive film for semiconductor use to give the wiring circuit being 20 N/m or greater at 25° C., and the 90 degree peel strengths, after molding with the molding compound the wiring circuit laminated with the adhesive film for semiconductor use, between the resin layer A and the wiring circuit and between the resin layer A and the molding compound, both being 1000N/m or less at at least one point in the temperature range of 0° C. to 250° C., and
wherein the resin layer A, which has adhesion, is formed on one side of the support film, and a resin layer B having no adhesion and an elastic modulus at 230° C. of 10 MPa or greater is formed on the opposite side thereof.

* * * * *